United States Patent
Vo et al.

(10) Patent No.: US 6,836,427 B2
(45) Date of Patent: Dec. 28, 2004

(54) SYSTEM AND METHOD TO COUNTERACT VOLTAGE DISTURBANCES IN OPEN DIGITLINE ARRAY DYNAMIC RANDOM ACCESS MEMORY SYSTEMS

(75) Inventors: Huy T. Vo, Boise, ID (US); Charles L. Ingalls, Meridian, ID (US); Howard C. Kirsch, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 79 days.

(21) Appl. No.: 10/163,404

(22) Filed: Jun. 5, 2002

(65) Prior Publication Data

US 2003/0227791 A1 Dec. 11, 2003

(51) Int. Cl.[7] .............................................. G11C 11/24
(52) U.S. Cl. .................... 365/149; 365/63; 365/210; 365/230.06
(58) Field of Search .................... 365/149, 63, 230.06, 365/230.05, 205, 207, 210, 222

(56) References Cited

U.S. PATENT DOCUMENTS

| | | | |
|---|---|---|---|
| 5,761,109 A | 6/1998 | Takashima et al. | 365/63 |
| 5,844,833 A | 12/1998 | Zagar et al. | 365/149 |
| 6,356,474 B1 | 3/2002 | Bissey et al. | 365/63 |
| 6,445,638 B1 * | 9/2002 | Hsu et al. | 365/230.05 |
| 6,501,672 B1 * | 12/2002 | Sekiguchi et al. | 365/72 |

* cited by examiner

Primary Examiner—Gene Auduong
(74) Attorney, Agent, or Firm—Dorsey & Whitney, LLP

(57) ABSTRACT

The disclosed system and method introduce voltage disturbances into a reference sub-array to offset voltage disturbances occurring in an active sub-array. The disclosed system and method connect extra, unused rows of memory cells to currently unused digitlines in the reference sub-array to cause surges that create voltage disturbances like those occurring in the active sub-array as a consequence of rows of memory cells in the active sub-array being connected to the active digitlines. As a result, when the sense amplifiers compare the voltages received on the active digitlines and the reference digitlines, the effects of the voltage disturbances on the active and reference digitlines lines offset each other.

81 Claims, 7 Drawing Sheets

SYSTEM AND METHOD TO COUNTERACT VOLTAGE DISTURBANCES IN OPEN DIGITLINE ARRAY DYNAMIC RANDOM ACCESS MEMORY SYSTEMS

TECHNICAL FIELD

This invention relates to DRAM devices. More particularly, the present invention is directed to DRAM devices employing open digitline array architecture.

BACKGROUND OF THE INVENTION

As is well known in the art, because the charged stored in dynamic random access memory ("DRAM") cells is highly transitory in nature, the contents of DRAM cells must be refreshed tens or hundreds of times per second. Sense amplifiers typically are used to refresh the contents of the DRAM cells. A sense amplifier compares voltages received on two digitlines, an active digitline and a reference digitline. The sense amplifier measures which of the two digitlines carries a higher voltage, and then drives the digitline carrying the higher voltage toward Vcc and the digitline carrying the lower voltage toward ground.

Prior to the refreshing of each DRAM cell, the active and reference digitlines are each equilibrated by isolating them from storage cells and precharging them to Vcc/2. To actually refresh the DRAM cell, the DRAM cell's access transistor is enabled to connect the DRAM cell's capacitor to the active digitline. Once the DRAM cell's access transistor is enabled, if the charge stored in the DRAM cell's capacitor is a high voltage charge, the voltage on the active digitline will increase to a level at least slightly higher than Vcc/2, while the voltage on the reference digitline remains at Vcc/2. The sense amplifier will then drive the active digitline toward Vcc and the reference digitline toward ground. Conversely, if the charge stored is a low voltage charge, the voltage on the active digitline will drop to a level at least slightly lower than Vcc/2 while the voltage on the reference digitline remains at Vcc/2. The sense amplifier will then drive the active digitline toward ground and the reference digitline toward Vcc. After the sense amplifier has driven the digitlines toward complementary voltages, the DRAM cell's access transistor could be disabled, storing the resulting high or low voltage charge in the DRAM cell's capacitor.

DRAM cells, as also is well known in the art, typically are refreshed a row at a time. The access transistor of each DRAM cell in each row is connected to a word line which enables the access transistor for every DRAM cell in that row. Generally, each column of DRAM cells is equipped with its own sense amplifier which is coupled to digitlines for each column, allowing for the entire row to be refreshed at one time. In refreshing a row of DRAM cells, current and voltage disturbances result across the array of DRAM cells and the array's cell plates as power consumed by the sense amplifiers increases to drive digitlines toward complementary voltages.

The active digitlines and reference digitlines may be connected to the same sub-array or different sub-arrays depending upon the array architecture of the device. FIGS. 1 and 2 illustrate the two predominant array architectures. FIG. 1 shows a folded digitline array architecture sub-array 100. The folded digitline array architecture is so named because, in the physical manifestation of the devices, the digitlines 102 actually are folded around each other between each memory cell 104. For visual simplicity, FIG. 1A does not show the actual folding of the digitlines 102; instead, the memory cells 104 are each depicted with the same orientation connected to two complementary digitlines 102. A sense amplifier 106 is coupled to digitlines 102 from each column 108 of memory cells 106, with the digitlines 102 connected to alternate memory cells 104 in each column. It is significant that each of the digitlines 102 connected to each sense amplifier 106 are connected to memory cells 104 in the same sub-array 100.

FIG. 2 shows a pair of open digitline architecture sub-arrays 200 and 202. Unlike the digitlines 102 (FIG. 1) in the folded digitline array architecture sub-array 100, the digitlines 204 (FIG. 2) connected to each of the sense amplifiers 206 in the open digitline array architecture sub-arrays 200 and 202 are not connected to memory cells 208 in the same sub-array. To the contrary, each sense amplifier 206 is connected to one digitline 204 in one sub-array 200 and one digitline 204 in a second sub-array 202. As can be readily inferred, the architecture is so named because the digitlines at the end of each sub-array are open to be connected to additional sub-arrays.

Each architecture has relative advantages over the other. For example, open digitline array architecture allows more memory cells 208 (FIG. 2) to be created per unit area. Theoretically, open digitline array architecture memory cells 208 require only $4F^2$ or $6F^2$ in area, where F represents the feature size, whereas folded digitline array architecture memory cells 104 (FIG. 1) require $8F^2$ in area.

On the other hand, folded digitline array architecture enjoys an advantage over open digitline array architecture in common mode rejection of voltage disturbances which occur when, for example, as rows of memory cells 104 (FIG. 1) are activated as memory cells are read or refreshed. Because the sense amplifiers 106 in a folded digitline array architecture sub-array 100 are coupled to adjacent digitlines 102 in the same sub-array 100, any voltage disturbances affecting the sub-array 100 affects both of the digitlines 102 approximately equally. Thus, when the sense amplifier 106 compares the voltages on the digitlines 102, any voltage disturbances affecting the digitlines 102 should cancel out one another.

By contrast, in open digitline array architecture sub-arrays 200 and 202 (FIG. 2), each of the sense amplifiers 206 is connected through digitlines 204 to memory cells 208 in two different sub-arrays 200 and 202. A voltage disturbance might occur in one sub-array connected to the sense amplifier 206, such as when a row is fired in that sub-array, whereas no such disturbance or a disturbance of a lesser degree might occur in the complementary sub-array where no activity is taking place. Consequently, a voltage carried by one of the digitlines 204 connected to a sense amplifier 206 may be increased or decreased by a voltage disturbance, while the other digitline 204 is undisturbed and, thus, its voltage remains unchanged. If such a disturbance were to cause the voltage on the active digitline to be in excess of Vcc/2 when the DRAM cell connected to that digitline was at a low voltage, the voltage on the active digitline might be greater than the voltage on the reference digitline. This would cause the sense amplifier 206 to read the wrong value or to refresh the DRAM cell with the wrong voltage. Thus, as a result of the voltage disturbance, the data of that DRAM cell stored a digit would be corrupted. Similarly, if a disturbance in the active array were to cause the voltage on the active digitline to be less than Vcc/2 when the DRAM cell connected to the active digitline was at a high voltage, the voltage on the active digitline might be less than the voltage on the reference digitline. As a result, the sense amplifier 206 might again read the wrong value from the DRAM cell or refresh the DRAM cell with the wrong voltage.

What is needed is a way to reduce the effect of voltage disturbances in open digitline array architecture memory arrays to avoid possible read and refresh errors. It is to reducing or eliminating this problem in open digitline array architecture DRAM devices that the present invention is directed.

SUMMARY OF THE INVENTION

The present invention is directed to a system and method for introducing voltage disturbances into a reference sub-array to offset voltage disturbances that may occur in an active sub-array. The voltage disturbances may be introduced by connecting extra or otherwise unused rows of memory cells to currently unused digitlines in the reference sub-array to create voltage disturbances like those occurring in the active sub-array as a consequence of rows of memory cells in the active sub-array being connected to the active digitlines. As a result, disturbances introduced in the reference sub-array coincide with similar disturbances naturally resulting in the active sub-array. When the sense amplifiers compare the voltages received on the active digitlines and the reference digitlines, the effects of the voltage disturbances on the respective digitlines offset each other. Worst case voltage disturbance scenarios are mimicked in the reference sub-array to accommodate worst case voltage disturbance scenarios occurring in the active sub-array.

DETAILED DESCRIPTION OF THE INVENTION

Figure 1:
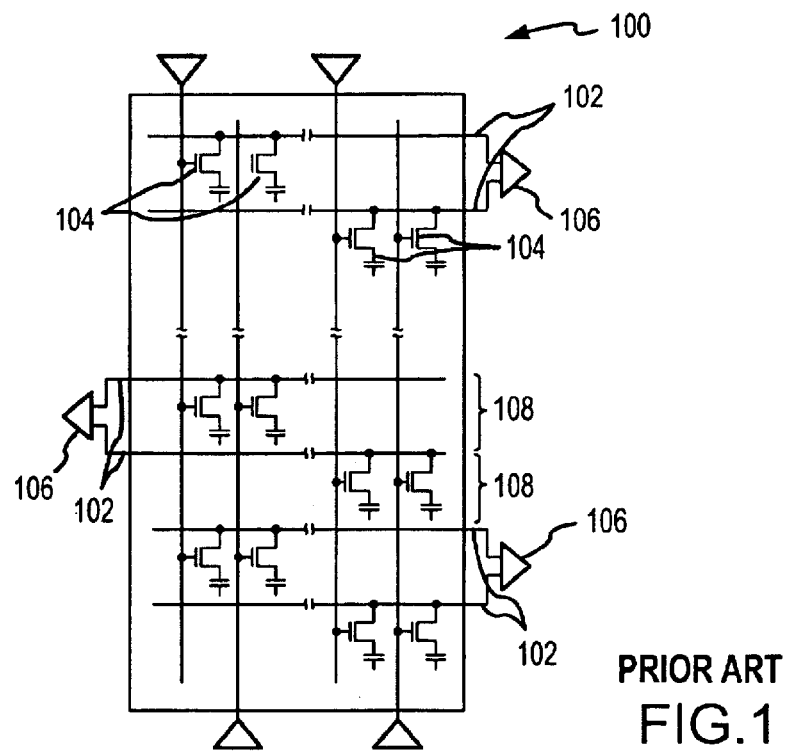
FIG. 1 is a schematic diagram of a conventional folded digitline array architecture sub-array.
Figure 2:
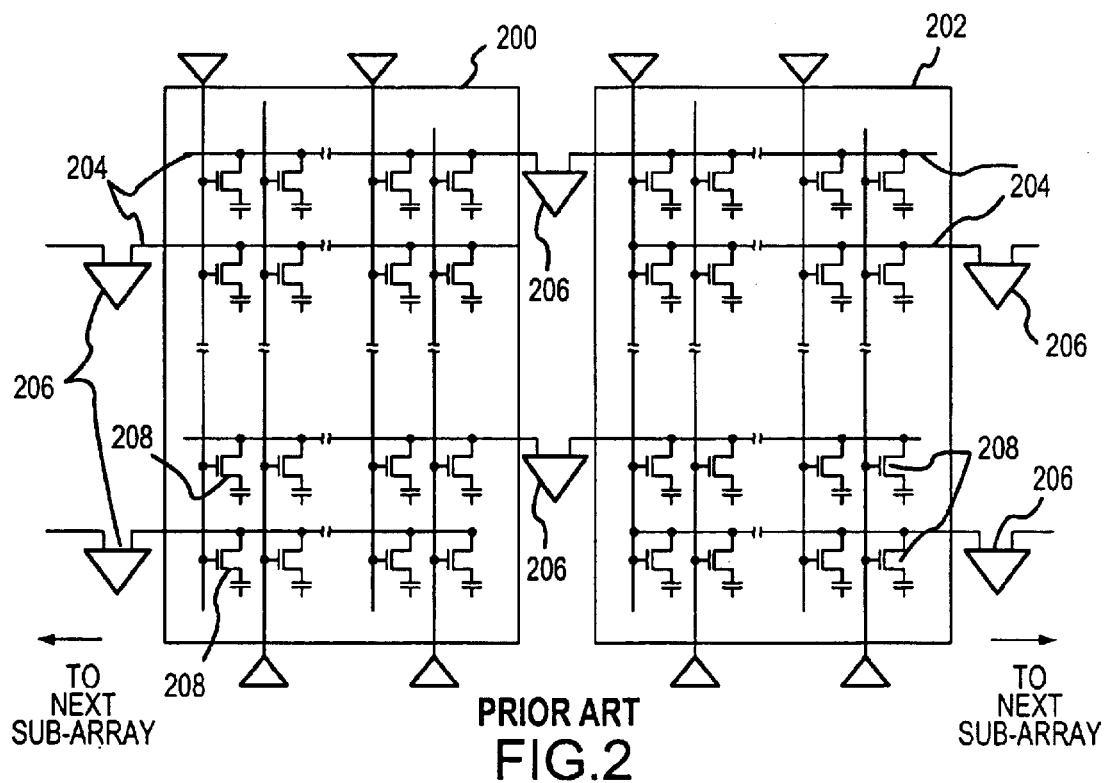
FIG. 2 is a schematic diagram of a pair of conventional open digitline array architecture sub-arrays.
Figure 3:
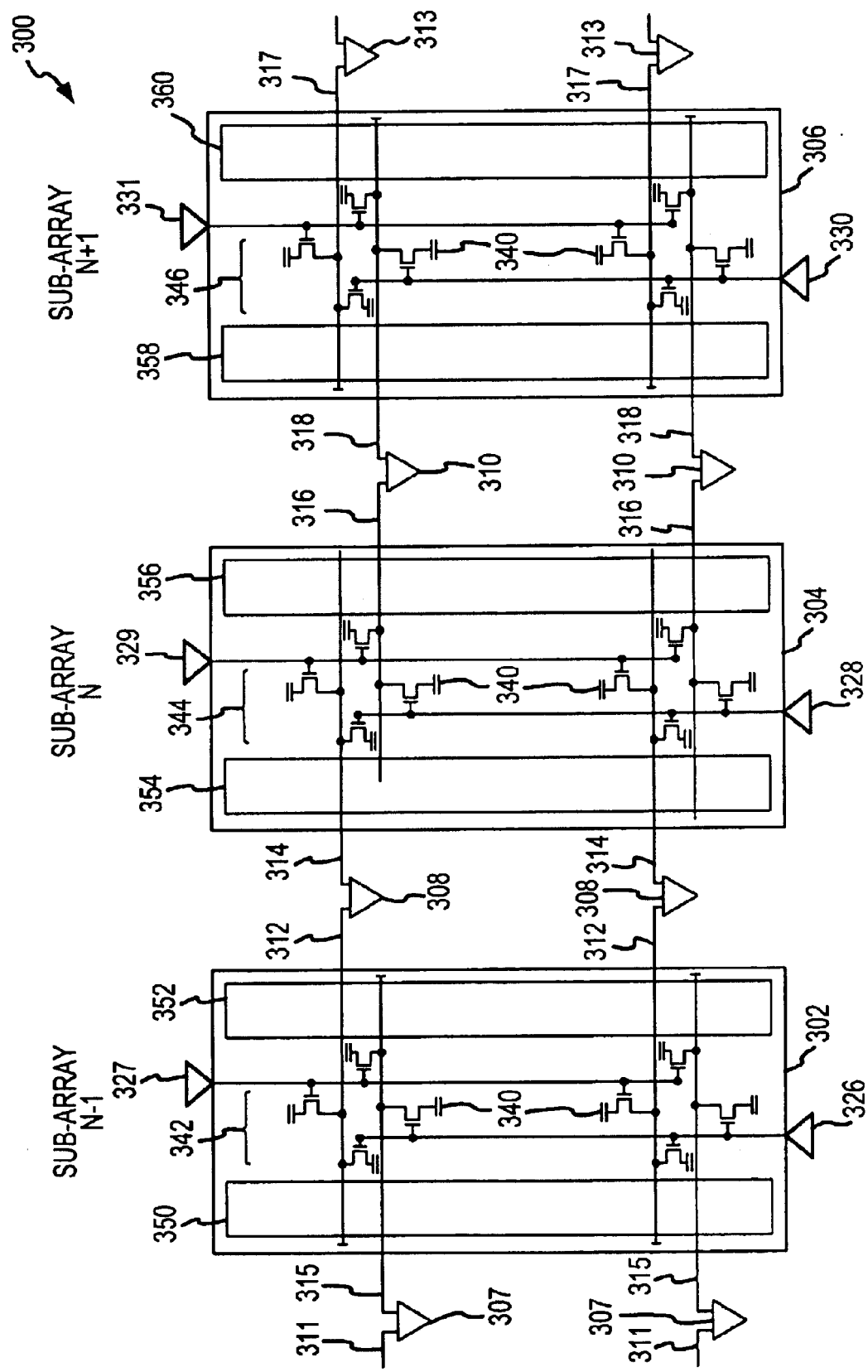
FIG. 3 is a block diagram of an embodiment of the present invention to illustrate the placement of an embodiment of the present invention in open digitline sub-arrays.

FIG. 3 shows a block diagram of a network of three open digitline array architecture sub-arrays 300 adapted with an embodiment of the present invention, including sub-array N−1 302, sub-array N 304, and sub-array N+1 306. Between sub-array N−1 302 and sub-array N 304 are a plurality of sense amplifiers 308, and between sub-array N 304 and sub-array N+1 306 are another plurality of sense amplifiers 310. Sense amplifiers 308 are coupled to digitlines 312 from sub-array N−1 302 and to digitlines 314 from sub-array N 304. Similarly, sense amplifiers 310 are coupled to digitlines 316 from sub-array N 304 and to digitlines 318 from sub-array N+1 306. Each sub-array 302, 304, 306, contains a multitude of memory cells 340 arranged in rows and columns. The access transistors of the memory cells 340 each are connected to word lines 326, 327, 328, 329, 330, 331, which control the activation of rows of memory cells 340 for reading and refreshing of the memory cells 340. Consistent with this being an open digitline array, digitlines 315 of sub-array N−1 are coupled with sense amplifiers 307 that compare voltage signals presented on digitlines 315 with voltage signals presented on digitlines 311 of sub-array N−2 (not shown). Similarly, digitlines 317 of sub-array N+1 are coupled with sense amplifiers 313 that will compare voltage signals presented on digitlines 317 with voltage signals presented on digitlines 319 of sub-array N+2 (not shown).

For illustration, assume that sub-array N−1 302 includes a row to be read or refreshed and, thus, is the active sub-array. The memory cells 340 to be read or refreshed are connected to digitlines 312 to carry the signals representing the voltages stored in memory cells 340 to the sense amplifiers 308. The digitlines 312, which couple active memory cells in the active sub-array N−1 302 to the sense amplifiers 308, are the active digitlines. Digitlines 314 serve as the reference digitlines, and connect the sense amplifiers 308 to sub-array N 304 which, therefore, serves as the reference sub-array.

Energizing word line 326 activates the memory cells 340 connected with it in the active sub-array N−1 302. As previously described, the connection of these memory cells 340 with the previously equilibrated digitline results in current surges and voltage disturbances in active sub-array N−1 302. By contrast, without an embodiment of the present invention, reference sub-array N 304 would not experience comparable current surges and voltage disturbances because no rows are activated so as to create a drain or surge against the cell plate. Comparison of the voltage carried by the disturbed active digitlines 312 and the undisturbed reference digitlines 314 might cause a misreading of their relative voltage by sense amplifiers 308. However, an embodiment of the present invention can be used to induce voltage disturbances in the reference sub-array N 304. These induced voltage disturbances will affect the voltages carried by reference digitlines 314 to offset the voltage disturbances affecting the active digitlines 312.

Embodiments of the present invention exploit the existence of extra and/or unused rows of memory included in the fabrication of the sub-arrays. The extra rows generally are of two types: redundant rows and spare rows. Redundant rows are extra rows included throughout the sub-arrays which can be substituted for defective rows existing in the sub-arrays. Redundant rows are intended to be used as back-up rows when rows originally intended to be used prove to be defective. Spare rows, on the other hand, are rows created without the expectation they will be used. In the process of manufacturing semiconductor devices, it is widely recognized that manufacturing errors which might result in one or more faulty memory cells are much more likely to occur at the lateral extremes of each device. Consequently, designers of these device include spare rows at the lateral extremes of each semiconductor devices as, basically, a sacrifice in recognition of this common problem in the manufacturing process. In other words, because defective rows are more likely to occur in rows at the ends of the device, by creating extra rows at the ends which are not intended to be used, any faults in manufacture that occur, hopefully, will occur in these outlying rows and in rows intended to be used.

One embodiment of the present invention uses the spare rows to disturb the reference sub-array. In FIG. 3, the disturbance devices comprise spare rows of memory cells as the periphery of each sub-array and their control mechanisms as shown in block form at the extremes of each sub-array as 350, 352, 354, 356, 358, and 360. More detail is shown about the disturbance devices 350, 352, 354, 356, 358, and 360 and how they might be controlled in FIGS. 4, 5A, and 5B. For the sake of visual simplicity and clarity, only a single row of memory cells 342, 344, and 346, is shown in each of the sub-arrays 302, 304, and 306, respectively, in FIGS. 3, 5A, and 5B.

Considering sub-array N, the memory cells in the spare rows 354 and 356 of sub-array N 304 would be connected to digitlines 314 and 316, respectively, that currently are not being used as either active digitlines or reference digitlines. For example, when digitline 316 is being used as a reference digitline for comparison with active digitline 318 in sub-array N+1 306, the disturbance devices 354 and 356 would be used to induce a disturbance on digitline 314 which runs parallel with digitline 316. Introduction of this disturbance in the reference sub-array N 304, therefore, would offset voltage disturbances caused in active sub-array N+1 306 so that the comparison by the sense amplifier 310 of reference digitline 316 and active digitline 318 will not be skewed by an unbalanced voltage disturbance in active sub-array N+1 306.

Generally, embodiments of the present invention store low voltage charges to each of the memory cells in spare rows used by disturbance devices 354 and 356 at each end of the reference sub-array N 304. Continuing with the same example, as the word line 331 is activated to connect the memory cells 340 to the active digitlines 318 in the active sub-array N+1 306, the spare rows are activated in the reference sub-array N 304. Just as activating the word line 331 in the active sub-array N+1 302 causes voltage disturbances in the signals carried by the active digitline 318, connecting the spare rows 354 and 356 with the unused digitline 314 in the reference sub-array 304 results in offsetting voltage disturbances on the reference digitline 316 in the reference sub-array N 304.

Embodiments of the present invention can counteract the worst case voltage disturbance scenario. As previously described, when all or nearly all of the memory cells 340 in the active row store charges of the same voltage, applying that row of memory cells 340 to the equilibrated digitline 314 results in the greatest possible drain or surge on the cell plate and, as a result, the greatest voltage disturbance. By deliberately creating an extreme voltage disturbance in the reference sub-array N 304, even in a worst-case scenario of voltage disturbance in the active sub-array N+1 306, the disturbances affecting the voltage signals received by the sense amplifiers 310 from both the active digitline 318 and the reference digitline 316 should offset and thereby negate each other.

Embodiments of the present invention selectively control which spare rows are charged and activated to induce voltage disturbances in the sub-arrays as needed to avoid unnecessary power usage. Embodiments of the present invention employ spare rows in the appropriate sub-array to generate voltage disturbances affecting the reference digitline without consuming power to charge memory cells and activate spare rows in sub-arrays which are not involved in sense amplifiers' current reading and refreshing of rows of memory cells. For example, if digitline 314 was the active digitline and digitline 312 was the reference digitline, disturbance devices 350 and 352 would charge the spare rows each controls to induce an offsetting voltage disturbance.

Figure 4:
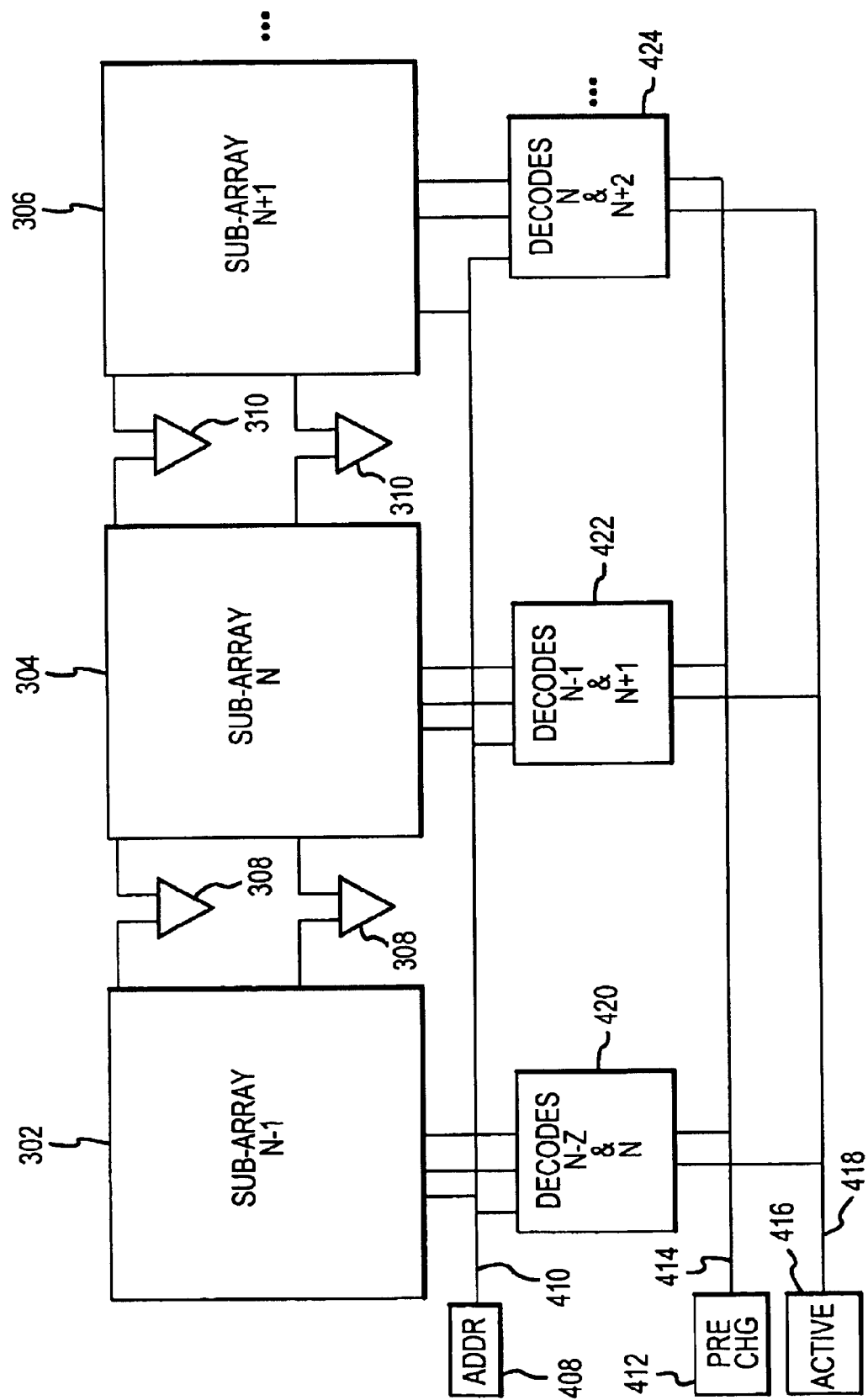
FIG. 4 is a block diagram of a control system for coordinating the operation of spare rows in sub-arrays employing an embodiment of the present invention.

FIG. 4 is a block diagram of a control system for directing the operation of the spare rows. Many of the same components are depicted in FIGS. 3, 4, 5A, and 5B. The same reference numerals are used for the same components in these figures and, in the interest of brevity, explanation of their functions and operations will not be repeated.

FIG. 4 also shows the three sub-arrays, sub-array N−1 302, sub-array N 304, and sub-array N+1 306. A plurality of sense amplifiers 308 and 310 are used to read active digitlines by comparisons with reference digitlines. An address control system 408 drives an address line 410 with an address which indicates which row needs to be accessed, and this address will indicate which of the three sub-arrays 302, 304, and 306 contains that row. In accordance with the disclosed embodiment of the present invention, depending on which sub-array 302, 304, 306 is the active sub-array, decoders 420, 422, 424 determine when any of the sub-arrays' spare rows need to be used in accordance with the disclosed embodiment of the present invention to induce voltage disturbances on a reference digitline. In particular, the decoder for sub-array N−1 420 makes use of one or more spare rows in sub-array N−1 302 when the active sub-array, as indicated by the address on the address line 410, is either sub-array N−2 (not shown) or sub-array N 304, both of which might use sub-array N−1 as a reference array. Similarly, the decoder for sub-array N 422 and the decoder for sub-array N+1 424 make use of the spare rows in sub-array N 304 and sub-array N+1 306, respectively, when the adjacent sub-arrays are specified as the active sub-array.

When one of the decoders 420, 422, 424 detects that an adjacent sub-array is the active sub-array, the decoders 420, 422, 424 pass along to the sub-arrays 302, 304, 306, respectively, the precharging signal and the active signal used to control the active sub-array. The precharging signal is transmitted by a precharge signal driver 412 on a precharge signal line 414. The active signal, which activates the memory cells in the row being read and/or refreshed, is transmitted by an active signal driver 416 on an active signal line 418. The precharging and active signals are communicated to the reference sub-arrays to induce voltage disturbances in the reference sub-arrays as previously described. During precharging of the active digitlines, memory cells in spare rows in an adjacent sub-array are precharged to zero while an unused digitline to which the memory cells are connected is equilibrated to Vcc/2. When the memory cells in the active row are activated, the memory cells in the spare rows are connected to the unused equilibrated digitline to induce voltage disturbances in the reference sub-array.

Figure 5A:
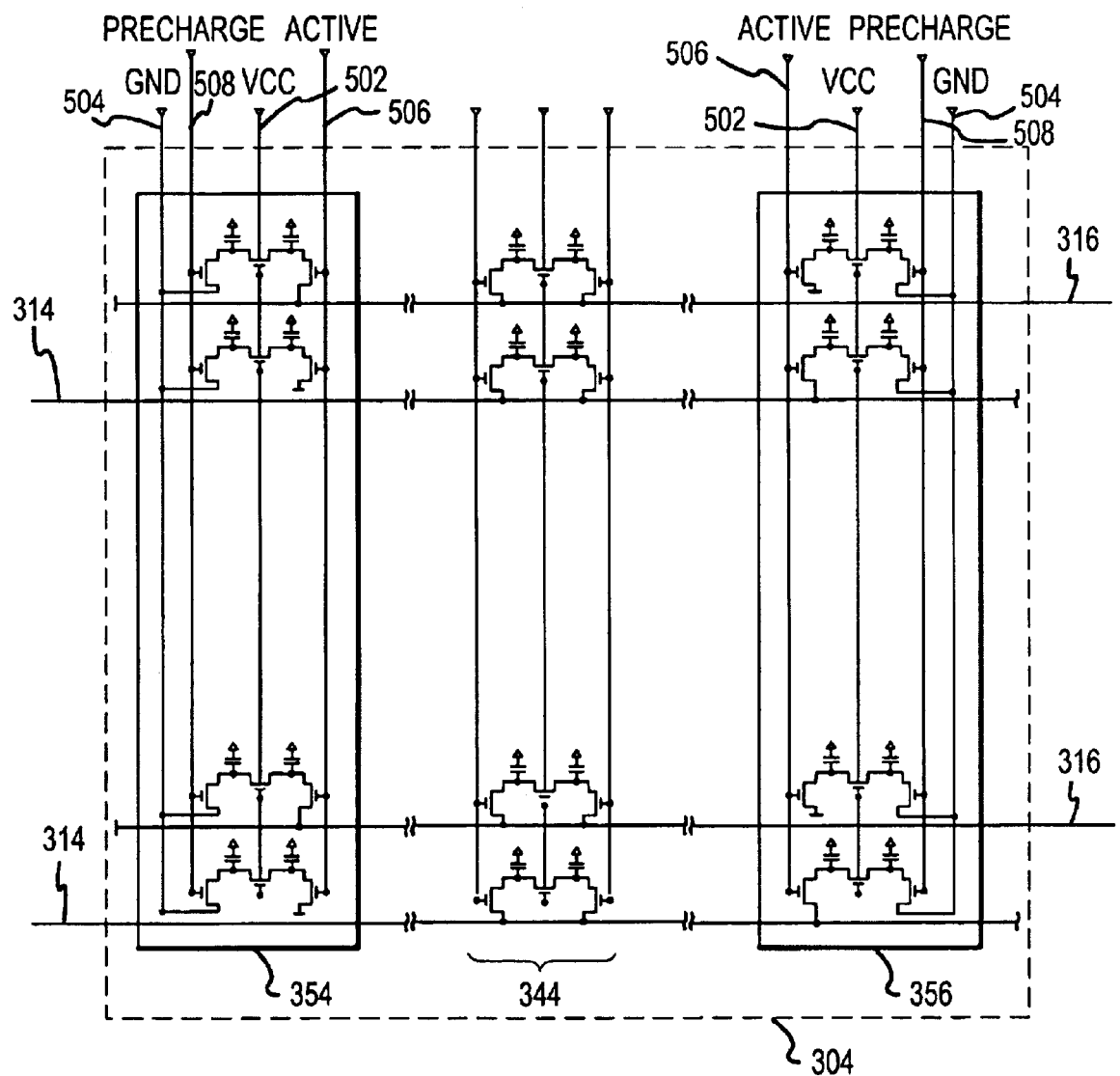
FIG. 5A is a schematic diagram showing a sub-array equipped with an embodiment of the present invention for inducing voltage disturbances in a reference array.

FIG. 5A shows an enlarged view of sub-array N 304 to show the disturbance devices 354 and 356 in greater detail. The disturbance devices 354 and 356 are coupled with the digitlines 314 and 316 which are used to induce voltage disturbances via one of these digitlines when the complementary digitline is being used as a reference digitline. In other words, the disturbance devices 354 and 356 engage digitline 314 when digitline 316 serves as a reference digitline for sub-array N+1 (shown in FIG. 3, but not FIG. 5A), and disturbance devices 354 and 356 engage digitline 316 when digitline 314 serves as a reference digitline for sub-array N−1 (shown in FIG. 3, but not FIG. 5A). Disturbance devices 354 and 356 have connections to Vcc 502 and ground 504, as well as an active signal line 506 and a precharge signal line 508.

Figure 5B:
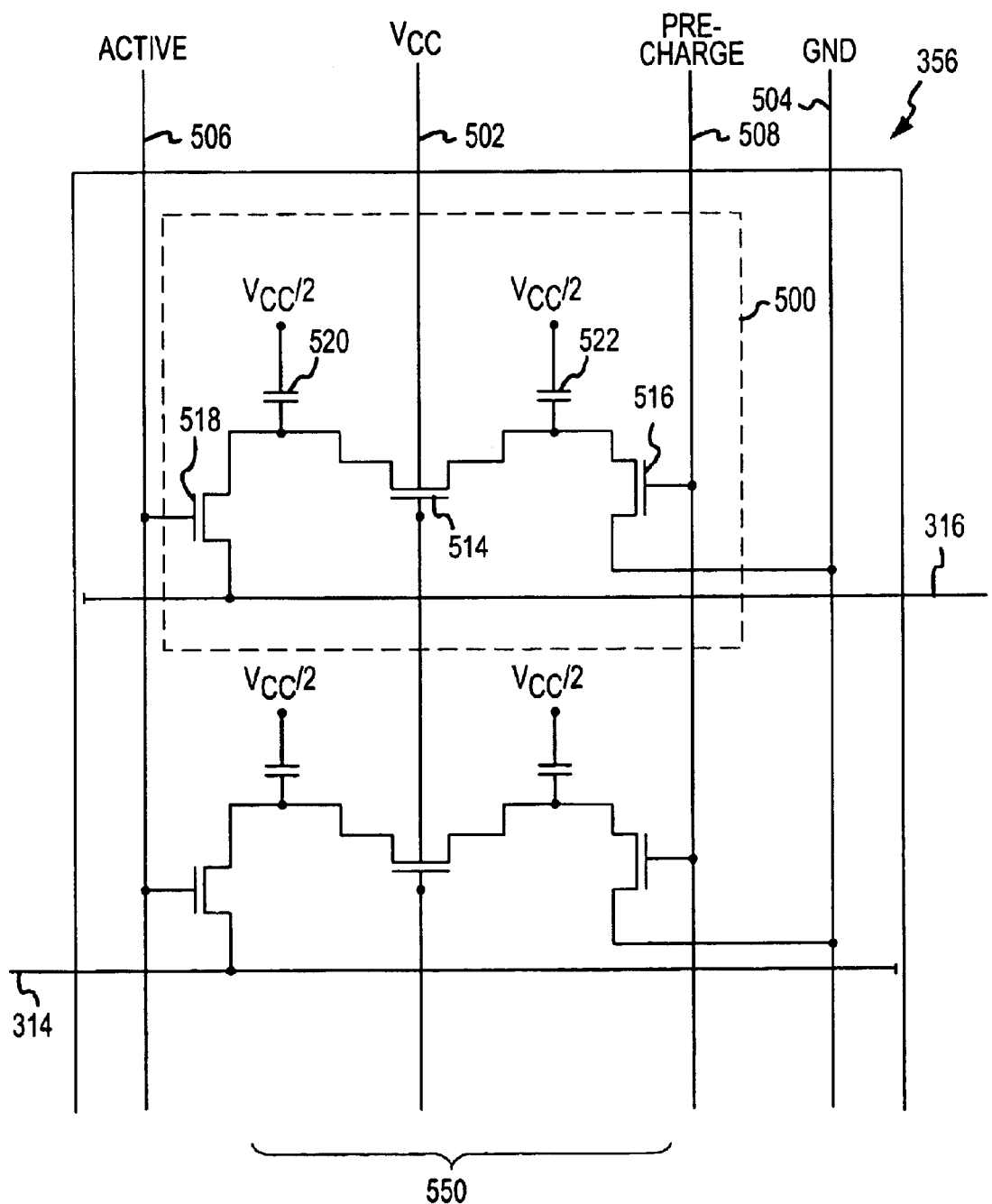
FIG. 5B is a schematic diagram of a section of a sub-array equipped with an embodiment of the present invention showing in greater detail devices employed to control spare rows of memory cells for inducing voltage disturbances in a reference array.

FIG. 5B shows in still greater detail the voltage disturbance inducing circuitry 500 receiving the precharging and active signals that could be used to control the spare rows to induce a voltage disturbance, for example, such as that employed in spare row section 356 (FIGS. 3, 4, and 5A). FIG. 5B again shows four connections, including connections to Vcc 502, ground 504, and active signal line 506 and precharge signal line 508. The operations of control lines 506 and 508 will be explained subsequently. Laterally, digitline 314 in the present example is the reference digitline to be compared by a sense amplifier (not shown) to the voltage read from an active digitline (also not shown). Digitline 316 is not used as either an active digitline or a reference digitline in the present operation, but is used by an embodiment of the present invention.

When digitline 314 is the reference digitline, spare rows of memory cells 550 are charged to a like voltage and then connected to the unused digitline 316 to induce voltage disturbances. The gate of transistor 514 is connected to Vcc 502 and, thus, signals may pass freely between the drain and source of the transistor 514. During precharge, the precharge signal line 508 carries a high voltage signal, thus the gate of transistor 516 is energized, allowing voltage to pass freely between its drain and source. At the same time, the active signal line 506 carries a low voltage signal, thus the gate of transistor 518 is de-energized, and thereby not allowing voltage to pass between its drain and source. De-energized transistor 518 isolates the digitline 512 from the other transistors while energized transistor 516 connects the isolated circuit to ground 504, effectively storing a low voltage charge by grounding the capacitors 520 and 522. During this time, as is usual, both the reference digitline 314 and the digitline 316 used by the disturbance device 356 are equilibrated to Vcc/2.

After precharging, when the precharging signal line 508 carries a low voltage signal and the active signal line 506 carries a high voltage signal, the opposite occurs: transistors 514 and 518 are cut off from ground 504 by de-energized transistor 516, and the circuit is connected to the equilibrated digitline 316 by the now energized transistor 518. Applying these stored low voltage charges to the digitline 316 causes voltage disturbances in reference sub-array N 304, to counteract voltage disturbances affecting an active digitline (not shown) in accordance with the disclosed embodiment of the present invention.

Voltage disturbances also could be generated in the voltage disturbance inducing circuitry 500 by storing high voltage charges in these cells, then applying that high voltage to an unused equilibrated digitline. It will be appreciated, however, that storing a high voltage charge to these voltage disturbance inducing circuits 500 would consume more power in bringing these cells up to high voltages than is required in storing low voltage charges in these cells.

Figure 6:
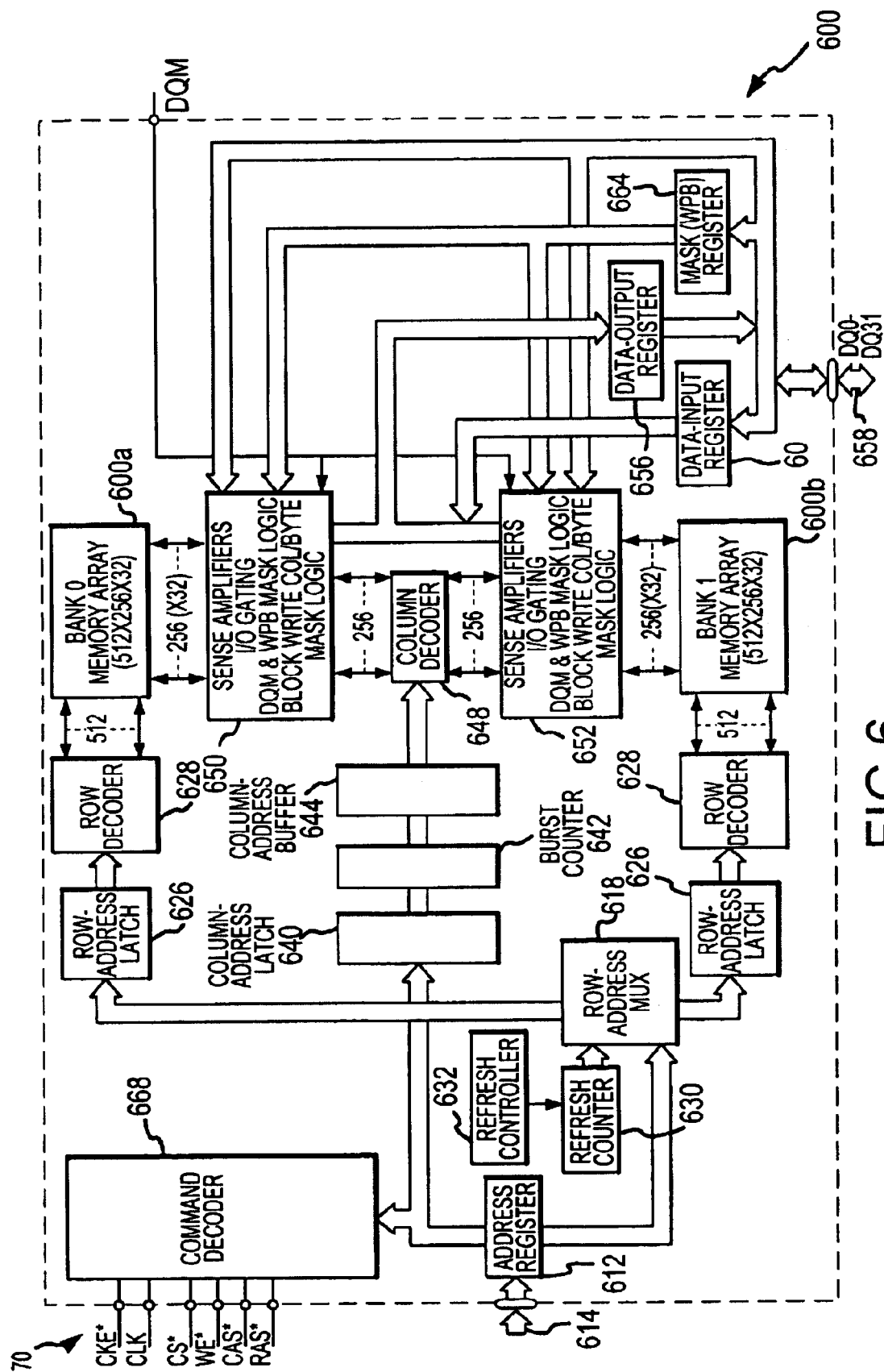
FIG. 6 is a block diagram of a SDRAM device incorporating an embodiment of the present invention.

A memory device employing an embodiment of the present invention is shown in FIG. 6. The memory device shown in FIG. 6 is a synchronous dynamic random access memory ("SDRAM") device 600, although embodiments of the present invention may be used in other DRAMs and other memory devices. The SDRAM device 600 includes an address register 612 that receives either a row address or a column address on an address bus 614. The address bus 614 is generally coupled to a memory controller (not shown). Typically, a row address is initially received by the address register 612 and applied to a row address multiplexer 618. The row address multiplexer 618 couples the row address to a number of components associated with either of two memory arrays 600a, 600b, depending upon the state of a bank address bit forming part of the row address. The memory arrays 600a, 600b have an open-array architecture incorporating one embodiment of the invention as shown in FIGS. 3, 4, and 5. Associated with each of the memory arrays 600a, 600b is a respective row address latch 626, which stores the row address, and a row decoder 628, which applies various signals to its respective memory array 600a or 600b as a function of the stored row address. The row address multiplexer 618 also couples row addresses to the row address latches 626 for the purpose of refreshing the memory cells in the memory arrays 600a, 600b. The row addresses are generated for refresh purposes by a refresh counter 630, which is controlled by a refresh controller 632.

After the row address has been applied to the address register 612 and stored in one of the row address latches 626, a column address is applied to the address register 612. The address register 612 couples the column address to a column address latch 640. Depending on the operating mode of the SDRAM device 600, the column address is either coupled through a burst counter 642 to a column address buffer 644, or to the burst counter 642, which applies a sequence of column addresses to the column address buffer 644 starting at the column address that is stored in the column-address latch. In either case, the column address buffer 644 applies a column address to a column decoder 648, which applies various column signals to respective sense amplifiers and associated column circuitry 650, 652 for the respective memory arrays 600a, 600b.

Data to be read from one of the memory arrays 600a, 600b are coupled to the column circuitry 650, 652 for one of the memory arrays 600a, 600b, respectively. The data are then coupled to a data output register 656, which applies the data to a data bus 658. Data to be written to one of the memory arrays 600a, 600b are coupled from the data bus 658 through a data input register 660 to the column circuitry 650, 652 and then are transferred to one of the memory arrays 600a, 600b, respectively. A mask register 664 may be used to selectively alter the flow of data into and out of the column circuitry 650, 652, such as by selectively masking data to be read from the memory arrays 600a, 600b.

The above-described operation of the SDRAM 600 is controlled by a command decoder 668 responsive to high level command signals received on a control bus 670. These high level command signals, which are typically generated by a memory controller (not shown), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 668 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

Figure 7:
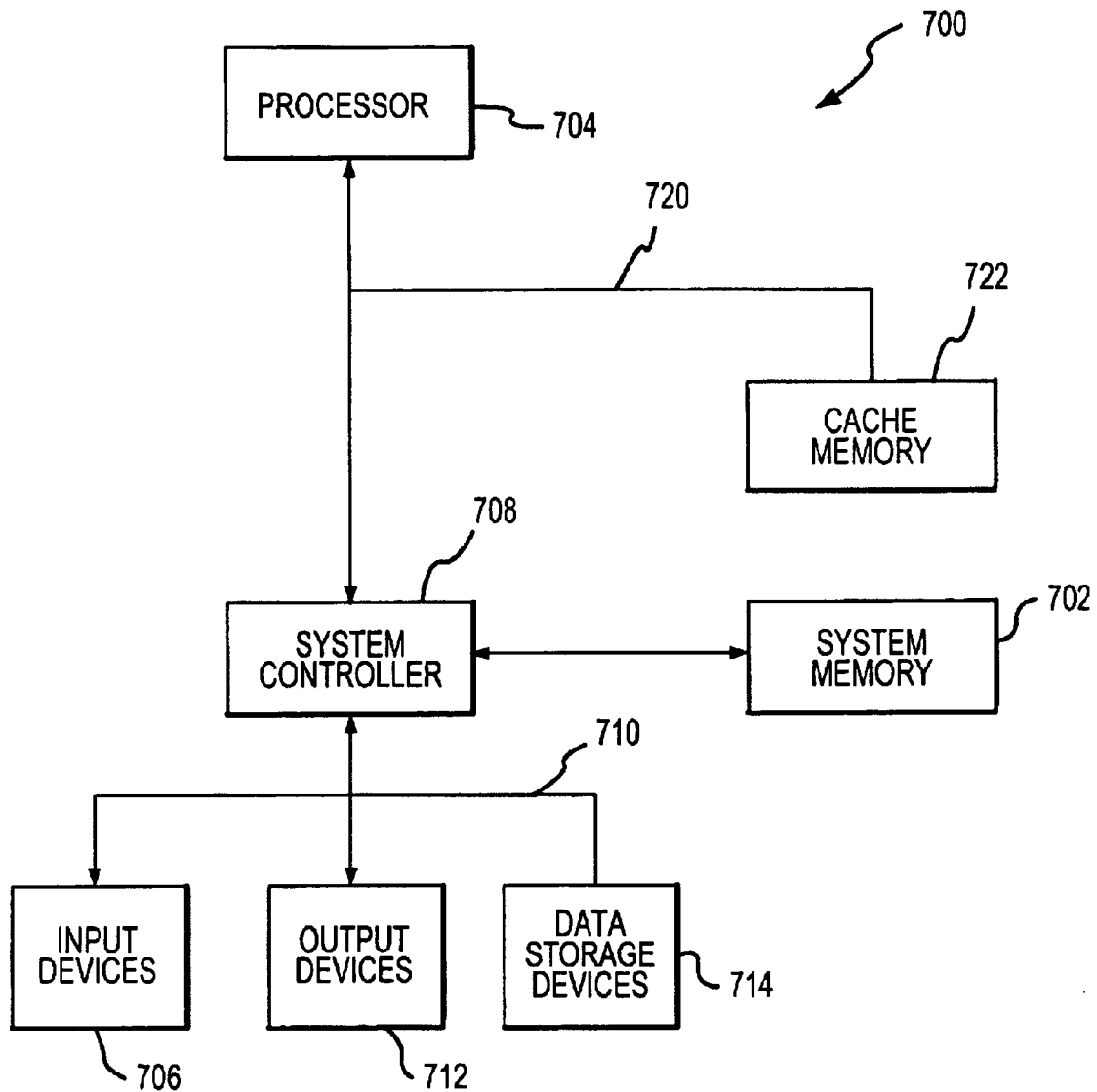
FIG. 7 is a block diagram of a computer system incorporating an embodiment of the present invention.

As shown in FIG. 7, a computer system 700 can take advantage of an embodiment of the present invention by incorporating in its system memory 702 DRAM devices adapted with an embodiment of the present invention as previously described. With reference to FIG. 7, a computer system 700 includes the system memory 702 and a processor 704 for performing various functions, such as performing specific calculations or tasks. In addition, the computer system 700 includes one or more input devices 706, such as a keyboard or a mouse, coupled to the processor 704 through a system controller 708 and a system bus 710 to allow an operator to interface with the computer system 700. Typically, the computer system 700 also includes one or more output devices 712 coupled to the processor 704, such output devices typically being a printer or a video terminal. One or more data storage devices 714 are also typically coupled to the processor 702 through the system controller 708 to store data or retrieve data from external storage media (not shown). Examples of typical data storage devices 714 include hard and floppy disks, tape cassettes, and compact disk read-only memories (CD-ROMs). The system memory 702 is coupled directly (not shown) to the processor 704 or to the system controller 708 to allow data to be written to and read from the system memory 702. The computer system 700 may also include a cache memory 722 coupled to the processor 702 through a processor bus 720 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. For example, an embodiment of the present invention could be applied to DRAM devices which include no spare rows if design and manufacturing choices were made not to include them; instead, other redundant rows of memory cells could also be used to induce voltage disturbances. Similarly, the rows of memory cells need neither be spare nor redundant, but merely reserved for inducing voltage disturbances in accordance with the present invention. Accordingly, the invention is not limited except as by the appended claims.

What is claimed is:

1. A voltage disturbance counteracting system for an open digitline array DRAM device, comprising:
   a plurality of extra memory cells not used for data storage in at least one extra row not currently used for data storage in a reference sub-array;
   a disturbance controller causing a voltage to be stored in the extra memory cells, the disturbance controller connecting the extra memory cells in the extra row to currently unused digitlines at the same time active memory cells in an active sub-array are connected to active digitlines, each of the active digitlines being coupled to a sense amplifier that is also coupled to one of the unused digitlines.

2. The voltage disturbance counteracting system of claim 1 wherein the spare memory cells are disposed in at least one spare row of memory cells of the DRAM device.

3. The voltage disturbance counteracting system of claim 1 wherein the extra memory cells are disposed in at least one redundant row of memory cells of the DRAM device.

4. The voltage disturbance counteracting system of claim 1 wherein the extra memory cells are disposed in at least one row of memory cells of the DRAM device reserved for use by the voltage disturbance counteracting system.

5. The voltage disturbance counteracting system of claim 1 wherein the extra memory cells are disposed in at least two rows of the DRAM device.

6. The voltage disturbance counteracting system of claim 1 wherein the voltage stored in the extra memory cells is a low voltage.

7. The voltage disturbance counteracting system of claim 1 wherein the voltage stored in the extra memory cells is a high voltage.

8. The voltage disturbance counteracting system of claim 1 wherein the active digitlines and unused digitlines are equilibrated before the active memory cells are connected to the active digitlines and the extra memory cells are connected to the unused digitlines.

9. The voltage disturbance counteracting system of claim 7 wherein the disturbance controller employs a plurality of transistors to connect the extra memory cells to a line supplying the high voltage to the extra memory cells while the active digitlines and unused digitlines are equilibrated.

10. The voltage disturbance counteracting system of claim 1 wherein the disturbance controller employs a plurality of transistors to connect the extra memory cells to the unused digitlines when the active memory cells are connected to the active digitlines.

11. The voltage disturbance counteracting system of claim 1 wherein the DRAM device is a synchronous DRAM device.

12. A voltage disturbance counteracting system for open digitline array DRAM devices, comprising:
   at least one row of unused memory cells in a reference sub-array;
   a plurality of unused digitlines not currently used as reference digitlines or active digitlines in a current memory operation;
   a charging system storing a voltage in the unused memory cells while digitlines are being equilibrated; and
   a memory cell controller connecting the unused memory cells in the spare row to the unused digitlines at the same time memory cells in an active sub-array are connected to the active digitline.

13. The voltage disturbance counteracting system of claim 12 wherein the unused memory cells are disposed in at least one spare row of memory cells of the DRAM device.

14. The voltage disturbance counteracting system of claim 12 wherein the unused memory cells are disposed in at least one redundant row of memory cells of the DRAM device.

15. The voltage disturbance counteracting system of claim 12 wherein the unused memory cells are disposed in at least one row of memory cells of the DRAM device reserved for use by the voltage disturbance counteracting system.

16. The voltage disturbance counteracting system of claim 12 wherein the unused memory cells are disposed in at least two rows of the DRAM device.

17. The voltage disturbance counteracting system of claim 12 wherein the voltage stored in the unused memory cells is a low voltage.

18. The voltage disturbance counteracting system of claim 12 wherein the voltage stored in the unused memory cells is a high voltage.

19. The voltage disturbance counteracting system of claim 12 wherein the active digitlines and unused digitlines are equilibrated before the active memory cells are connected to the active digitlines and the unused memory cells are connected to the unused digitlines.

20. The voltage disturbance counteracting system of claim 12 wherein the memory cell controller employs a plurality of transistors to connect the unused memory cells to a line supplying the voltage to the extra memory cells while the active digitlines and unused digitlines are equilibrated.

21. The voltage disturbance counteracting system of claim 12 wherein the memory cell controller employs a plurality of transistors to connect the unused memory cells to the unused digitlines when the active memory cells are connected to the active digitlines.

22. The voltage disturbance counteracting system of claim 12 wherein the DRAM device is a synchronous DRAM device.

23. An open digitline array DRAM device comprising:
a plurality of sub-arrays of memory cells, the memory cells being disposed in rows and columns;
a plurality of sense amplifiers disposed between the sub-arrays, each of the sense amplifiers receiving a first digitline from a column of memory cells in a first sub-array and second digitline from a column of memory cells in a second sub-array;
a row addressing system operably connected to the DRAM device, the row addressing system responsive to a row address signal by accessing a row in the DRAM device corresponding to the row address signal;
a refresh indicator signaling when a row of memory cells is to be refreshed;
a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
a voltage disturbance counteracting system, comprising:
a plurality of extra memory cells not used for data storage in at least one row not currently used for data storage in the first sub-array;
a disturbance controller storing a voltage in the extra memory cells, the spare row controller connecting the memory cells in the spare row to currently unused digitlines at the same time active memory cells in the second sub-array are connected to active digitlines.

24. The open digitline array DRAM device of claim 23 wherein the extra memory cells are disposed in at least one spare row of memory cells of the DRAM device.

25. The open digitline array DRAM device of claim 23 wherein the extra memory cells are disposed in at least one redundant row of memory cells of the DRAM device.

26. The open digitline array DRAM device of claim 23 wherein the extra memory cells are disposed in at least one row of memory cells of the DRAM device reserved for use by the voltage disturbance counteracting system.

27. The open digitline array DRAM device of claim 23 wherein the extra memory cells are disposed in at least two rows of the DRAM device.

28. The open digitline array DRAM device of claim 23 wherein the voltage stored in the extra memory cells is a low voltage.

29. The open digitline array DRAM device of claim 23 wherein the voltage stored in the extra memory cells is a high voltage.

30. The open digitline array DRAM device of claim 23 wherein the active digitlines and unused digitlines are equilibrated before the active memory cells are connected to the active digitlines and the extra memory cells are connected to the unused digitlines.

31. The open digitline array DRAM device of claim 30 wherein the disturbance controller employs a plurality of transistors to connect the extra memory cells to a line supplying the voltage to the extra memory cells while the active digitlines and unused digitlines are equilibrated.

32. The open digitline array DRAM device of claim 23 wherein the disturbance controller employs a plurality of transistors to connect the extra memory cells to the unused digitlines when the active memory cells are connected to the active digitlines.

33. The open digitline array DRAM device of claim 23 wherein the DRAM device is a synchronous DRAM device.

34. An open digitline array PRAM device comprising:
a plurality of sub-arrays of memory cells, the memory cells being disposed in rows and columns;
a plurality of sense amplifiers disposed between the sub-arrays, each of the sense amplifiers receiving a first digitline from a column of memory cells in a first sub-array and second digitline from a column of memory cells in a second sub-array;
a row addressing system operably connected to the DRAM device, the row addressing system responsive to a row address signal by accessing a row in the DRAM device corresponding to the row address signal;
a refresh indicator signaling when a row of memory cells is to be refreshed;
a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
a voltage disturbance counteracting system, comprising:
at least one row of unused memory cells in the first sub-array;
a plurality of unused digitlines not currently used as reference digitlines or active digitlines in a current memory operation;
a charging system storing voltage in the unused memory cells while digitlines are being equilibrated; and
an unused memory cell controller connecting the unused memory cells in the spare row to the unused digitlines at the same time memory cells in the second sub-array are connected to the active digitline.

35. The open digitline array DRAM device of claim 34 wherein the unused memory cells are disposed in at least one spare row of memory cells of the DRAM device.

36. The open digitline array DRAM device of claim 34 wherein the unused memory cells are disposed in at least one redundant row of memory cells of the DRAM device.

37. The open digitline array DRAM device of claim 34 wherein the unused memory cells are disposed in at least one row of memory cells of the DRAM device reserved for use by the voltage disturbance counteracting system.

38. The open digitline array DRAM device of claim 34 wherein the unused memory cells are disposed in at least two rows of the DRAM device.

39. The open digitline array DRAM device of claim 34 wherein the voltage stored in the unused memory cells is a low voltage.

40. The open digitline array DRAM device of claim 34 wherein the voltage stored in the unused memory cells is a high voltage.

41. The open digitline array DRAM device of claim 34 wherein the active digitlines and unused digitlines are equilibrated before the active memory cells are connected to the active digitlines and the unused memory cells are connected to the unused digitlines.

42. The open digitline array DRAM device of claim 34 wherein the unused memory cell controller employs a plurality of transistors to connect the unused memory cells to a line supplying the voltage to the extra memory cells while the active digitlines and unused digitlines are equilibrated.

43. The open digitline array DRAM device of claim 34 wherein the disturbance controller employs a plurality of transistors to connect the unused memory cells to the unused digitlines when the active memory cells are connected to the active digitlines.

44. The open digitline array DRAM device of claim 34 wherein the DRAM device is a synchronous DRAM device.

45. A computer system, comprising:
a processor;
an input device, operably connected to the processor, allowing data to be entered into the computer system;
an output device, operably connected to the processor, allowing data to be output from the computer system; and
a system memory operably connected to the processor through a system bus, the system memory comprising a plurality of open digitline array DRAM devices having a plurality of rows of DRAM cells, the DRAM cells receiving, storing, and outputting data, at least one of the DRAM devices comprising:
a plurality of sub-arrays of memory cells, the memory cells being disposed in rows and columns;
a plurality of sense amplifiers disposed between the sub-arrays, each of the sense amplifiers receiving a first digitline from a column of memory cells in a first sub-array and second digitline from a column of memory cells in a second sub-array;
a row addressing system operably connected to the DRAM device, the row addressing system responsive to a row address signal by accessing a row in the DRAM device corresponding to the row address signal;
a refresh indicator signaling when a row of memory cells is to be refreshed;
a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
a voltage disturbance counteracting system, comprising:
a plurality of extra memory cells not used for data storage in at least one row not currently used for data storage in the first sub-array;
a disturbance controller storing a voltage in the extra memory cells, the spare row controller connecting the memory cells in the spare row to currently unused digitlines at the same time active memory cells in the second sub-array are connected to active digitlines.

46. The computer system of claim 45 wherein the extra memory cells are disposed in at least one spare row of memory cells of the DRAM device.

47. The computer system of claim 45 wherein the extra memory cells are disposed in at least one redundant row of memory cells of the DRAM device.

48. The computer system of claim 45 wherein the extra memory cells are disposed in at least one row of memory cells of the DRAM device reserved for use by The computer system.

49. The computer system of claim 45 wherein the extra memory cells are disposed in at least two rows of the DRAM device.

50. The computer system of claim 45 wherein the voltage stored in the extra memory cells is a low voltage.

51. The computer system of claim 45 wherein the voltage stored in the extra memory cells is a high voltage.

52. The computer system of claim 45 wherein the active digitlines and unused digitlines are equilibrated before the active memory cells are connected to the active digitlines and the extra memory cells are connected to the unused digitlines.

53. The computer system of claim 52 wherein the disturbance controller employs a plurality of transistors to connect the extra memory cells to a line supplying the voltage to the extra memory cells while the active digitlines and unused digitlines are equilibrated.

54. The computer system of claim 45 wherein the disturbance controller employs a plurality of transistors to connect the extra memory cells to the unused digitlines when the active memory cells are connected to the active digitlines.

55. The computer system of claim 45 wherein the DRAM device is a synchronous DRAM device.

56. A computer system, comprising:
a processor;
an input device, operably connected to the processor, allowing data to be entered into the computer system;
an output device, operably connected to the processor, allowing data to be output from the computer system; and
a system memory operably connected to the processor through a system bus, the system memory comprising a plurality of open digitline array DRAM devices having a plurality of rows of DRAM cells, the DRAM cells receiving, storing, and outputting data, at least one of the DRAM devices comprising:
a plurality of sub-arrays of memory cells, the memory cells being disposed in rows and columns;
a plurality of sense amplifiers disposed between the sub-arrays, each of the sense amplifiers receiving a first digitline from a column of memory cells in a first sub-array and second digitline from a column of memory cells in a second sub-array;
a row addressing system operably connected to the DRAM device, the row addressing system responsive to a row address signal by accessing a row in the DRAM device corresponding to the row address signal;
a refresh indicator signaling when a row of memory cells is to be refreshed;
a row refreshing circuit, operably connected with the row addressing system, the DRAM cells, and the refresh indicator, the row refreshing circuit directing a refresh of at least one row of memory cells in response to the refresh indicator signaling a row of memory cells is to be refreshed; and
a voltage disturbance counteracting system for open digitline array DRAM devices, comprising:
at least one row of unused memory cells in the first sub-array;
a plurality of unused digitlines not currently used as reference digitlines or active digitlines in a current memory operation;
a charging system storing voltage in the unused memory cells while digitlines are being equilibrated; and
an unused memory cell controller connecting the unused memory cells in the spare row to the unused digitlines at the same time memory cells in the second sub-array are connected to the active digitline.

57. The computer system of claim 56 wherein the unused memory cells are disposed in at least one spare row of memory cells of the DRAM device.

58. The computer system of claim 56 wherein the unused memory cells are disposed in at least one redundant row of memory cells of the DRAM device.

59. The computer system of claim 56 wherein the unused memory cells are disposed in at least one row of memory cells of the DRAM device reserved for use by the voltage disturbance counteracting system.

60. The computer system of claim 56 wherein the unused memory cells are disposed in at least two rows of the DRAM device.

61. The computer system of claim 56 wherein the voltage stored in the unused memory cells is a low voltage.

62. The computer system of claim 56 wherein the voltage stored in the unused memory cells is a high voltage.

63. The computer system of claim 56 wherein the active digitlines and unused digitlines are equilibrated before the active memory cells are connected to the active digitlines and the unused memory cells are connected to the unused digitlines.

64. The computer system of claim 56 wherein the unused memory cell controller employs a plurality of transistors to connect the unused memory cells to a line supplying the voltage to the extra memory cells while the active digitlines and unused digitlines are equilibrated.

65. The computer system of claim 56 wherein the disturbance controller employs a plurality of transistors to connect the unused memory cells to the unused digitlines when the active memory cells are connected to the active digitlines.

66. The computer system of claim 56 wherein the DRAM device is a synchronous DRAM device.

67. A method for counteracting voltage disturbances in reading and refreshing memory cells in an open digitline array DRAM device, the method comprising:

selecting a plurality of extra memory cells not used for data storage in at least one row of a reference sub-array, digitlines of the reference sub-array being connected to digitlines of an active sub-array through a sense amplifier;

storing a voltage in the extra memory cells; and connecting the extra memory cells to unused digitlines at the same time active memory cells in the active sub-array are connected to active digitlines.

68. The voltage disturbance counteracting method of claim 67 wherein the extra memory cells are selected in a spare row of the DRAM device.

69. The voltage disturbance counteracting method of claim 67 wherein the extra memory cells are selected in a redundant row of the DRAM device.

70. The voltage disturbance counteracting method of claim 67 wherein the extra memory cells are selected in a row of the DRAM device reserved for use by the voltage disturbance counteracting method.

71. The voltage disturbance counteracting method of claim 67 wherein the voltage stored in the extra memory cells is a low voltage.

72. The voltage disturbance counteracting method of claim 67 wherein the voltage stored in the extra memory cells is a high voltage.

73. The voltage disturbance counteracting method of claim 67 further comprising equilibrating the active digitlines and the unused digitlines before the active memory cells are connected to the active digitlines and the extra memory cells are connected to the unused digitlines.

74. The voltage disturbance counteracting method of claim 73 further comprising storing the voltage in the extra memory cels while equilibrating the active digitlines and the unused digitlines.

75. A method for counteracting voltage disturbances in reading and refreshing memory cells in an open digitline array DRAM device, the method comprising:

selecting a plurality of unused memory cells not used for data storage in at least one row of a reference sub-array, digitlines of the reference sub-array being connected to digitlines of an active sub-array through a sense amplifier;

selecting a plurality of unused digitlines in the reference sub-array;

storing a voltage in the unused memory cells while the unused digitlines and a plurality of active digitlines are being equilibrated; and connecting the extra memory cells to the unused digitlines at the same time active memory cells in an active sub-array are connected to active digitlines.

76. The voltage disturbance counteracting method of claim 75 wherein the unused memory cells are selected in a spare row of the DRAM device.

77. The voltage disturbance counteracting method of claim 75 wherein the unused memory cells are selected in a redundant row of the DRAM device.

78. The voltage disturbance counteracting method of claim 75 wherein the unused memory cells are selected in a row of the DRAM device reserved for use by the voltage disturbance counteracting method.

79. The voltage disturbance counteracting method of claim 75 wherein the voltage stored in the unused memory cells is a low voltage.

80. The voltage disturbance counteracting method of claim 75 wherein the voltage stored in the unused memory cells is a high voltage.

81. The voltage disturbance counteracting method of claim 75 further comprising storing the voltage in the unused memory cells while equilibrating the active digitlines and the unused digitlines.

* * * * *